United States Patent
Hosoya et al.

(10) Patent No.: US 10,957,515 B2
(45) Date of Patent: Mar. 23, 2021

(54) PLASMA PROCESSING METHOD AND PLASMA PROCESSING APPARATUS

(71) Applicant: Tokyo Electron Limited, Tokyo (JP)

(72) Inventors: Masanori Hosoya, Miyagi (JP); Soichiro Kimura, Miyagi (JP); Shinya Morikita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 472 days.

(21) Appl. No.: 15/896,435

(22) Filed: Feb. 14, 2018

(65) Prior Publication Data

US 2018/0233331 A1   Aug. 16, 2018

(30) Foreign Application Priority Data

Feb. 16, 2017 (JP) .............................. JP2017-027065

(51) Int. Cl.
*H01L 21/02* (2006.01)
*C23C 16/455* (2006.01)
(Continued)

(52) U.S. Cl.
CPC ........ *H01J 37/32183* (2013.01); *C23C 16/26* (2013.01); *C23C 16/4405* (2013.01); *C23C 16/45523* (2013.01); *C23C 16/509* (2013.01); *H01J 37/32449* (2013.01); *H01J 37/32862* (2013.01); *H01L 21/0234* (2013.01); *H01L 21/31116* (2013.01); *H01L 21/768* (2013.01); *H01L 21/76897* (2013.01); *H01J 2237/334* (2013.01)

(58) Field of Classification Search
None
See application file for complete search history.

(56) References Cited

U.S. PATENT DOCUMENTS 5,085,727 A * 2/1992 Steger ............... H01J 37/32495
156/345.47
5,486,235 A * 1/1996 Ye ......................... B08B 7/0035
134/1.1
(Continued)

FOREIGN PATENT DOCUMENTS

JP  H04-229619  8/1992
JP  H10-096082  4/1998
(Continued)

*Primary Examiner* — Allan W. Olsen
(74) *Attorney, Agent, or Firm* — IPUSA, PLLC (57) ABSTRACT

A plasma processing method is provided that includes applying a radio frequency power to an upper electrode of a chamber, and performing a coating process by supplying a coating gas, including a carbon-containing gas, to an interior of the chamber to generate a plasma from the supplied coating gas, and coating the interior of the chamber with a carbon film using the plasma generated from the coating gas. The plasma processing method further includes performing an etching process after the coating process by supplying an etching gas, including a fluorocarbon-containing gas, to the interior of the chamber to generate a plasma from the supplied etching gas and etching a first silicon-containing film that is arranged on a second silicon-containing film covering an electrode formed on a workpiece using the plasma generated from the etching gas.

8 Claims, 5 Drawing Sheets

(51) Int. Cl.
*H01L 21/311* (2006.01)
*C23C 16/509* (2006.01)
*C23C 16/26* (2006.01)
*H01L 21/768* (2006.01)
*C23C 16/44* (2006.01)
*H01J 37/32* (2006.01)

(56) References Cited

U.S. PATENT DOCUMENTS

| | | | | |
|---|---|---|---|---|
| 6,537,429 | B2 * | 3/2003 | O'Donnell | B01J 19/0073 |
| | | | | 204/192.1 |
| 6,838,388 | B2 * | 1/2005 | Tadokoro | H01L 21/31116 |
| | | | | 257/E21.252 |
| 8,282,734 | B2 * | 10/2012 | Padhi | C23C 16/0254 |
| | | | | 118/715 |
| 2017/0076956 | A1 * | 3/2017 | Hirayama | H01J 37/32449 |
| 2017/0345666 | A1 * | 11/2017 | Morikita | H01J 37/32532 |
| 2018/0197720 | A1 * | 7/2018 | Morikita | C23C 16/401 |

FOREIGN PATENT DOCUMENTS

| | | |
|---|---|---|
| JP | 2008-050670 | 3/2008 |
| JP | 2009-188257 | 8/2009 |
| JP | 2016-012712 | 1/2016 |
| JP | 2016-111177 | 6/2016 |
| WO | 2013/011784 | 1/2013 |

* cited by examiner

|  | W/O CARBON COATING | W/ CARBON COATING |
|---|---|---|
| DEPTH | 143.6 nm | 145.0 nm |
| SiN LOSS | 9.0 nm | 7.6 nm |
| SEL. | 9.9 | 11.9 |
| SHOULDER | DAMAGED | DAMAGE FREE |

PLASMA PROCESSING METHOD AND PLASMA PROCESSING APPARATUS

CROSS-REFERENCE TO RELATED APPLICATION

The present application is based on and claims the benefit of priority to Japanese Patent Application No. 2017-027065 filed on Feb. 16, 2017, the entire contents of which are hereby incorporated by reference.

BACKGROUND OF THE INVENTION

1. Field of the Invention

The present invention relates to a plasma processing method and a plasma processing apparatus.

2. Description of the Related Art

In plasma processing apparatuses, when a radio frequency (RF) power is applied to an electrode arranged inside a chamber, the surface of a member arranged inside the chamber tends to be consumed by plasma. In particular, when a radio frequency power is applied to an upper electrode, a plasma is generated around a region closer to the ceiling of the chamber as compared with the case where a radio frequency power is applied to a lower electrode, and as such, the surface of the upper electrode is easily consumed. As a result, silicon included in a member constituting the upper electrode may be ejected from the upper electrode and byproducts may be generated to thereby adversely affect etching characteristics of a workpiece, for example.

In this respect, a technique is known that involves using a plasma of an oxygen-containing gas and a silicon-containing gas to form a silicon oxide film on the surface of a member inside the chamber before performing a plasma process in order to protect the member inside the chamber (see e.g., Japanese Unexamined Patent Publication No. 2016-12712).

However, the above-described technique is merely directed to preventing consumption of the member inside the chamber and does not provide a solution for improving etching characteristics of a film of a workpiece subjected to plasma processing.

SUMMARY OF THE INVENTION

An aspect of the present invention is directed to improving selectivity and etching characteristics of a film subjected to plasma processing.

According to one embodiment of the present invention, a plasma processing method is provided that includes applying a radio frequency power to an upper electrode of a chamber, and performing a coating process by supplying a coating gas, including a carbon-containing gas, to an interior of the chamber to generate a plasma from the supplied coating gas, and coating the interior of the chamber with a carbon film using the plasma generated from the coating gas. The plasma processing method further includes performing an etching process after the coating process by supplying an etching gas, including a fluorocarbon-containing gas, to the interior of the chamber to generate a plasma from the supplied etching gas and etching a first silicon-containing film that is arranged on a second silicon-containing film covering an electrode formed on a workpiece using the plasma generated from the etching gas.

DESCRIPTION OF THE PREFERRED EMBODIMENTS

In the following, embodiments of the present invention will be described with reference to the accompanying drawings. Note that in the present description and drawings, elements and features that are substantially identical are given the same references numerals and overlapping descriptions may be omitted.

[Plasma Processing Apparatus Overall Configuration]

Figure 1:
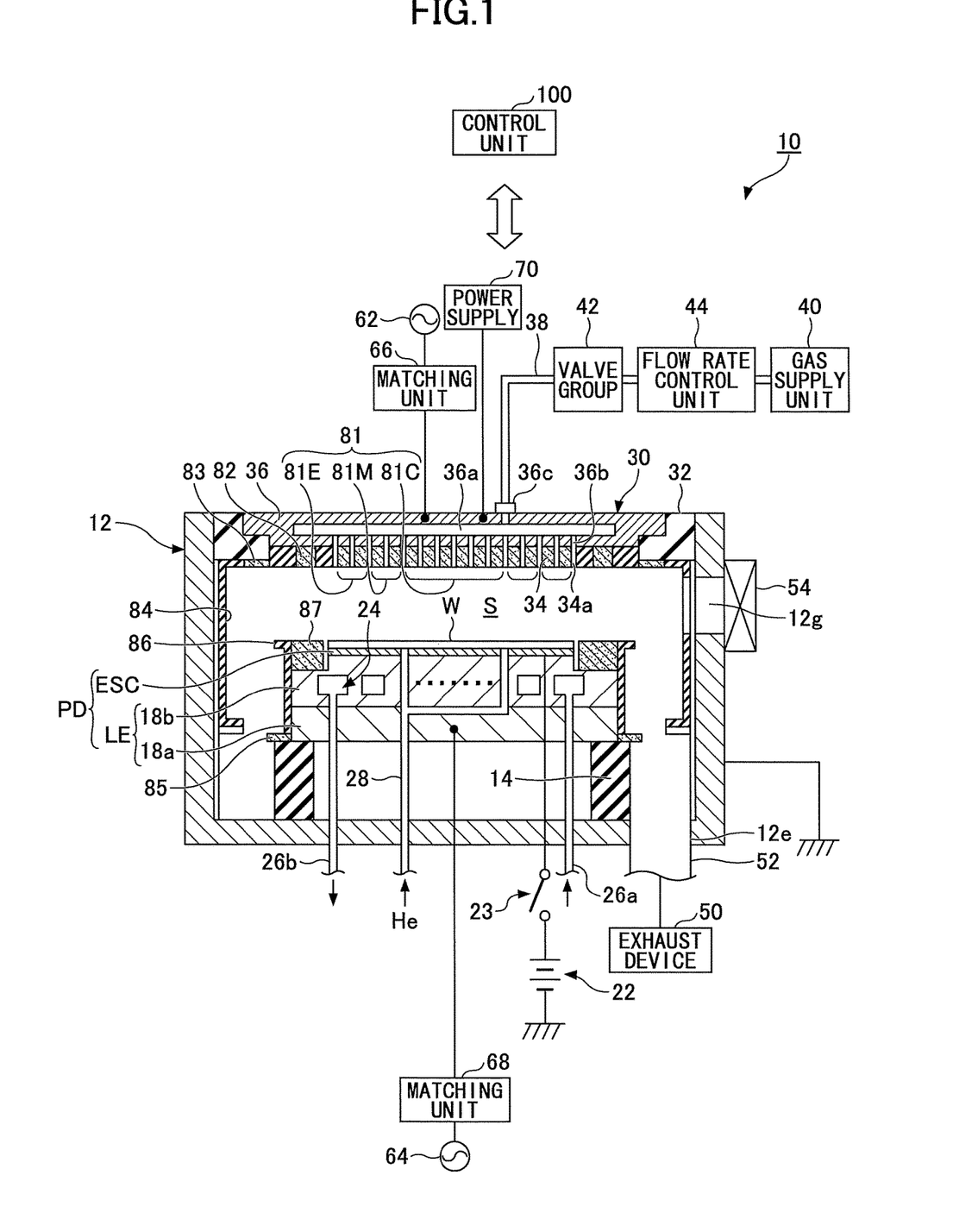
FIG. 1 is a diagram showing an example of a plasma processing apparatus according to an embodiment of the present invention.

First, the overall configuration of a plasma processing apparatus 10 according to an embodiment of the present invention will be described with reference to FIG. 1. FIG. 1 shows an example overall configuration of the plasma processing apparatus 10 according to an embodiment of the present invention. Note that a capacitively coupled plasma etching apparatus is described below as an example of the plasma processing apparatus 10 according to the present embodiment.

The plasma processing apparatus 10 is a capacitively coupled plasma etching apparatus and includes a substantially cylindrical chamber 12. The inner wall surface of the chamber 12 may be made of anodized aluminum, for example. The chamber 12 is grounded.

A substantially cylindrical support 14 is provided at a bottom portion of the chamber 12. The support 14 may be made of an insulating material, for example. The support 14 is arranged inside the chamber 12 and extends vertically from the bottom portion of the chamber 12. Also, a pedestal PD is arranged inside the chamber 12. The pedestal PD is supported by the support 14.

The pedestal PD holds a wafer W, as an example of a workpiece, on its upper surface. The pedestal PD includes a lower electrode LE and an electrostatic chuck ESC. The lower electrode LE includes a first plate 18a and a second plate 18b. The first plate 18a and the second plate 18b are made of a metal such as aluminum, for example, and are arranged into substantially disc shapes. The second plate 18b is arranged on the first plate 18a and is electrically connected to the first plate 18a.

The electrostatic chuck ESC is arranged on the second plate 18b. The electrostatic chuck ESC has an electrode made of a conductive film arranged between a pair of insulating layers or insulating sheets. A DC power supply 22 is electrically connected to the electrode of the electrostatic chuck ESC via a switch 23. The electrostatic chuck ESC attracts the wafer W by an electrostatic force, such as a Coulomb force, generated by a DC voltage from the DC power supply 22. In this way, the wafer W may be held by the electrostatic chuck ESC.

A focus ring (F/R) 87 is arranged on a peripheral portion of the second plate 18b to surround the edges of the wafer W and the electrostatic chuck ESC. The focus ring 87 is provided in order to improve etching uniformity. The focus ring 87 is made of a material appropriately selected in view of the material of the film to be etched. In the present embodiment, the focus ring 87 is made of silicon. A cover ring (C/R) 86 is arranged on the outer periphery of the focus ring 87 to cover the side surface of the pedestal PD. The cover ring 86 is made of quartz ($SiO_2$). A silicon ring (Si RING) 85 surrounding a bottom portion of the side surface of the pedestal PD is provided at a bottom end portion of the cover ring 86.

A coolant flow path 24 is arranged within the second plate 18b. The coolant flow path 24 constitutes a temperature control mechanism. A coolant is supplied from a chiller unit provided outside the chamber 12 to the coolant flow path 24 via a pipe 26a. The coolant supplied to the coolant flow path 24 is returned to the chiller unit via a pipe 26b. In this way, the coolant is circulated in the coolant flow path 24 and the chiller unit. By controlling the temperature of the coolant, the temperature of the wafer W that is held by the electrostatic chuck ESC can be controlled.

The plasma processing apparatus 10 also includes a heat transfer gas supply line 28. A heat transfer gas, such as helium (He) gas, from a heat transfer gas supply mechanism is passed through the heat transfer gas supply line 28 to be supplied between the upper surface of the electrostatic chuck ESC and the bottom surface of the wafer W.

The plasma processing apparatus 10 also includes an upper electrode 30. The upper electrode 30 is arranged above the pedestal PD to face the pedestal PD. The lower electrode LE and the upper electrode 30 are arranged substantially parallel to each other. A processing space S for performing a plasma process on the wafer W is provided between the upper electrode 30 and the lower electrode LE.

The upper electrode 30 may include an electrode plate 34 and an electrode support 36. The electrode plate 34 faces the processing space S, and a plurality of gas holes 34a are formed in the electrode plate 34. In the present embodiment, the electrode plate 34 is made of silicon. The upper electrode 30 is supported at an upper portion of the chamber 12 via an insulating shield member 32. In one embodiment, the upper electrode 30 may be arranged such that its vertical distance from the upper surface of the pedestal PD (wafer mounting surface) can be changed.

The electrode support 36 detachably supports the electrode plate 34. The electrode support 36 may be made of a conductive material such as aluminum, for example. The electrode plate 34 includes a silicon member (hereinafter also referred to as "inner cell (I-CEL) 81") formed at a center portion. The electrode plate 34 also includes a silicon member formed at the outer peripheral side of the inner cells 81 (hereinafter referred to as "outer cell (O-CEL) 82"). The outer cell 82 is interposed between insulators and is arranged between the insulating shield member 32 and the inner cell 81.

The inner cell 81 includes an inner cell (I-CEL(C)) 81C (C: center) at a center portion, an inner cell (I-CEL(E)) 81E (E: edge) at an outermost peripheral portion, and an inner cell (I-CEL(M)) 81M (M: middle) arranged between the inner cells 81C and 81E. The inner cell 81C has a disk shape, and the outer cell 82 has a ring shape.

The electrode support 36 may include a water cooling structure, for example. A gas diffusion chamber 36a is provided within the electrode support 36. A plurality of gas flow holes 36b communicating with the gas holes 34a extend downward from the gas diffusion chamber 36a. Also, a gas inlet 36c for guiding a processing gas to the gas diffusion chamber 36a is formed in the electrode support 36, and a gas supply pipe 38 is connected to the gas inlet 36c.

A ring-shaped silicon member (hereinafter also referred to as "ground ring (GND RING) 83") is arranged at an outer peripheral side of the outer cell 82 on a bottom surface of the insulating shield member 32, and an insulator is interposed between the outer cell 82 and the ground ring 83. A quartz ring (Qz RING) 84 is arranged to cover a ceiling surface portion at the outer peripheral side of the ground ring 83 and a side wall portion toward the processing space S of the chamber 12.

The gas supply pipe 38 is connected to a gas supply unit 40 via a valve group 42 and a flow rate control unit 44. The gas supply unit 40 includes a plurality of gas sources. For example, the gas supply unit 40 may supply an oxygen-containing gas in a dry cleaning process. An example of the oxygen-containing gas is $O_2$ gas.

In another example, the gas supply unit 40 may supply a gas including a carbon-containing gas in a coating process. Examples of the carbon-containing gas include a hydrocarbon gas, a hydrofluorocarbon gas, and a fluorocarbon gas. Specific examples of the carbon-containing gas may include at least one of $CH_4$ gas, $CH_3F$ gas, $O_4F_6$ gas, $C_4F_8$ gas, $C_5F_8$ gas, and $C_6F_6$ gas. The gas including a carbon-containing gas to be supplied in the coating process may be a gas mixture of $CH_4$ gas and an inert gas, for example.

In another example, the gas supply unit 40 may supply a gas including a fluorocarbon-containing gas in an etching process. For example, the gas including a fluorocarbon-containing gas may be a gas mixture obtained by adding an inert gas to $C_4F_6$ gas. As a specific example, a gas mixture obtained by adding Ar gas to $C_4F_6$ gas may be supplied in the etching process. As another example, in the etching process, steps of supplying a gas mixture of Ar gas and $C_4F_6$ gas and then supplying only Ar gas with no $C_4F_6$ gas may be repeated a predetermined number of times. Note that examples of the inert gas that may be used include He gas, Ne gas, and Xe gas in addition to Ar gas.

The valve group 42 includes a plurality of valves, and the flow rate control unit 44 includes a plurality of flow rate controllers such as mass flow controllers. The plurality of gas sources of the gas supply unit 40 are connected to the gas supply pipe 38 via corresponding valves of the valve group 42 and corresponding flow controllers of the flow control unit 44.

An exhaust plate may be provided at the bottom side of the chamber 12 between the support 14 and the side wall of the chamber 12, for example. The exhaust plate may be formed by coating a ceramic material on an aluminum material, for example. An exhaust port 12e is provided below the exhaust plate in the chamber 12. An exhaust device 50 is connected to the exhaust port 12e via an exhaust pipe 52. The exhaust device 50 includes a vacuum pump, such as a turbo molecular pump, so that the interior of the chamber 12 can be depressurized to a desired degree of vacuum. Also, a loading/unloading port 12g for loading/unloading the wafer W is provided on a side wall portion of the chamber 12. The loading/unloading port 12g can be opened and closed by a gate valve 54.

The plasma processing apparatus 10 further includes a first radio frequency power supply 62 and a second radio frequency power supply 64. The first radio frequency power supply 62 is an example of a radio frequency power unit that generates a radio frequency power HF for plasma generation. The radio frequency power HF generated by the first radio frequency power supply 62 may have a frequency of 60 MHz, for example. The first radio frequency power supply 62 is connected to the upper electrode 30 via a matching unit 66. The matching unit 66 is a circuit for matching the output impedance of the first radio frequency power supply 62 and the input impedance of the load (upper electrode 30).

The second radio frequency power supply 64 generates a radio frequency bias power LF for attracting ions into the wafer W. The radio frequency bias power LF generated by the second radio frequency power supply 64 may have a frequency of 20 MHz, for example. The second radio frequency power supply 64 is connected to the lower electrode LE via a matching unit 68. The matching unit 68 is a circuit for matching the output impedance of the second radio frequency power supply 64 and the input impedance of the load (lower electrode LE).

The plasma processing apparatus 10 further includes a power supply 70. The power supply 70 is connected to the upper electrode 30. The power supply 70 applies to the upper electrode 30 a voltage for attracting positive ions in the processing space S into the electrode plate 34. In one example, the power supply 70 may be a DC power supply that generates a negative DC voltage. In another example, the power source 70 may be an AC power source that generates an AC voltage of a relatively low frequency. The voltage applied from the power supply 70 to the upper electrode 30 may be −150 V or less, for example. That is, the voltage applied to the upper electrode 30 by the power supply 70 may be a negative voltage having an absolute value greater than or equal to 150, for example. When such a voltage is applied from the power supply 70 to the upper electrode 30, positive ions in the processing space S may collide with the electrode plate 34. As a result, secondary electrons and/or silicon may be released from the electrode plate 34. The released silicon bonds with active species of fluorine in the processing space S to thereby reduce the amount of the active species of fluorine.

Also, in one embodiment, the plasma processing apparatus 10 may further include a control unit 100. The control unit 100 is a computer including a processor, a storage unit, an input device, and a display device, for example, and is configured to control various components of the plasma processing apparatus 10. The input device of the control unit 100 may be used by an operator to input commands for managing the plasma processing apparatus 10, for example. The display device of the control unit 100 may be used to visually display the operation state of the plasma processing apparatus 10, for example. The storage unit of the control unit 100 may store various programs, such as control programs for enabling the processor to control various processes executed by the plasma processing apparatus 10 and programs for causing various components of the plasma processing apparatus 10 to execute processes according to processing conditions (i.e., process recipes).

[Plasma Process]

Figure 2:
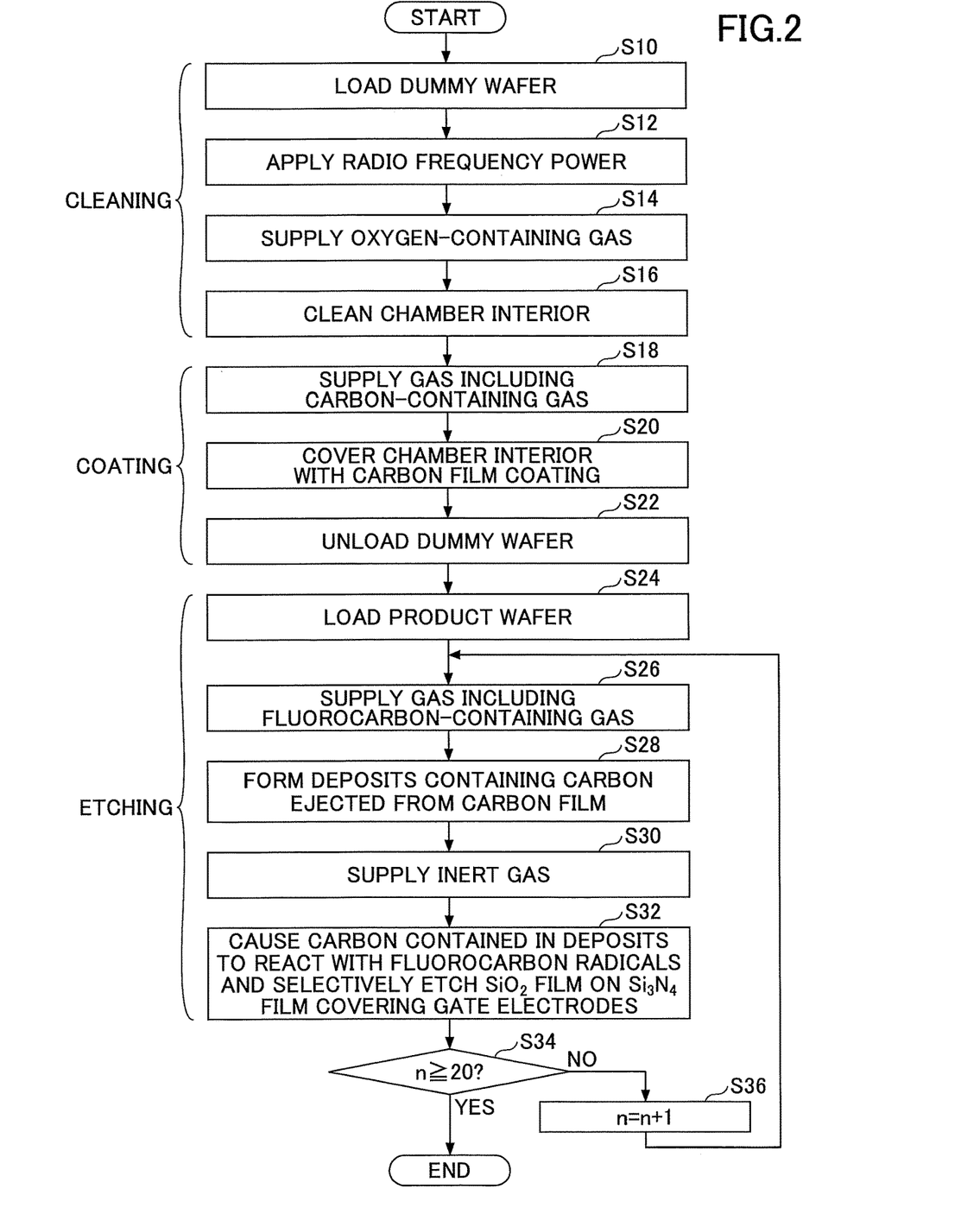
FIG. 2 is a flowchart showing a plasma process including a coating process according to an embodiment of the present invention.
Figure 3:
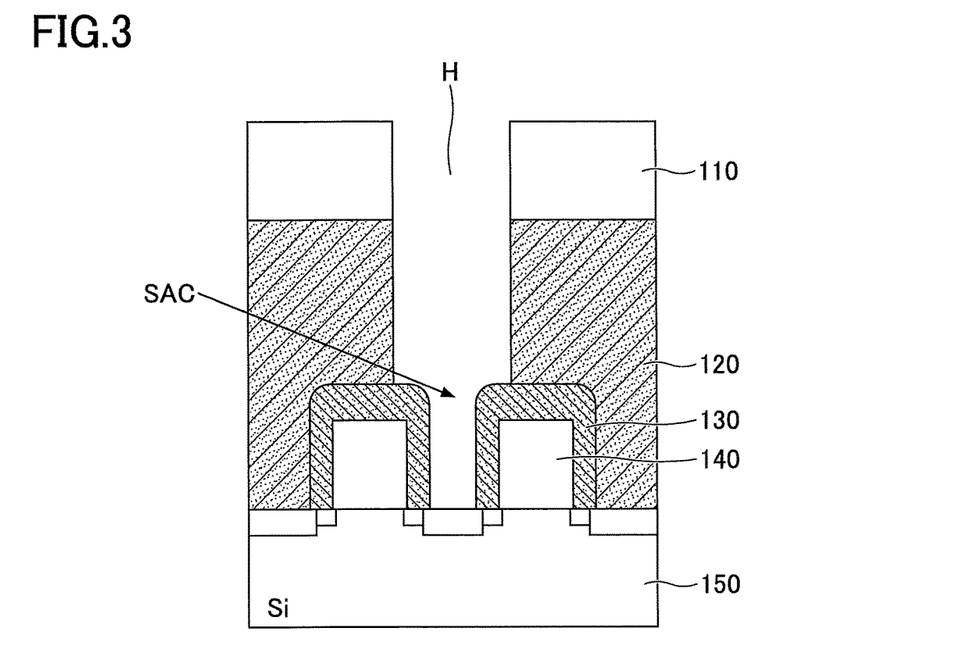
FIG. 3 is a cross-sectional diagram showing an example of a self-aligned contact process.

In the following, an example plasma process including a coating process that is implemented by the plasma processing apparatus 10 having the above-described configuration will be described with reference to FIGS. 2 and 3. FIG. 2 is a flowchart showing an example plasma process including a coating process according to an embodiment of the present invention. FIG. 3 is a cross-sectional diagram showing a SAC (Self-Aligned Contact) process.

In the plasma process according to the present embodiment, first, a cleaning process is performed for cleaning the chamber 12 as shown in FIG. 2 (steps S10 to S16). Then, a coating process is performed in the chamber 12 (steps S18 to S22). Then, an etching process is performed on a product wafer (steps S24 to S36). Note that each of the above process steps is controlled by the control unit 100.

The SAC process involves forming a contact hole H between gate electrodes 140 formed on a silicon (Si) substrate 150 of the wafer W by etching a $SiO_2$ film 120 that is arranged on the gate electrodes 140 into a pattern of a resist 110. At the time the $SiO_2$ film 120 is etched, the gate electrodes 140 are covered by a $Si_3N_4$ film 130 that serves as an etching stopper so that the contact hole H and the gate electrodes 140 may be prevented from short-circuiting even when the formation position of the contact hole H is deviated.

When a radio frequency power RF that is greater than or equal to a predetermined power is applied to the upper electrode 30 in the SAC process, the etching through performance (etching characteristics) tends to be degraded. That is, as a result of applying the radio frequency power RF to the upper electrode 30, silicon constituting the upper electrode 30 is ejected and dispersed into the processing space S mainly by the action of ions in a plasma generate by the radio frequency power RF, and the silicon reaching the contact hole H is deposited thereon to cause degradation of etching characteristics.

In this respect, in the plasma process including a coating process according to the present embodiment, the interior of the chamber 12 is precoated with a carbon film before performing an etching process for forming the contact hole H, and in this way, silicon of the upper electrode 30 may be prevented from dispersing into the processing space S and adhering to the wafer W. Further, by applying the radio frequency power RF to the upper electrode 30 in the etching process, carbon ejected by the action of plasma from the carbon film covering the upper electrode 30 may be supplied to the processing space S. In this way, the selectivity of the $SiO_2$ film 120 to the $Si_3N_4$ film 130 may be improved and etching characteristics for forming the contact hole H may be improved. As a result, by using optimum coating conditions for precoating the interior of the chamber 12 with a carbon film, consumption of the gate electrodes 140 may be prevented while improving etching characteristics at the same time.

Referring back to FIG. 2, detailed process steps of the plasma process according to the present embodiment will be described. When the plasma process is started, the control unit 100 controls the cleaning process for cleaning the chamber 12. Specifically, the control unit 100 loads a dummy wafer into the chamber 12 (step S10). The dummy wafer is placed on the pedestal PD to be held by the pedestal PD. Then, the control unit 100 applies the radio frequency power HF for plasma generation from the first radio frequency power supply 62 to the upper electrode 30 and applies the radio frequency power LF for bias attraction from the second radio frequency power supply 64 to the lower electrode LE (step S12). Then, the control unit 100 supplies an oxygen-containing gas as a cleaning gas (step S14). For example, the control unit 100 may supply $O_2$ gas as the oxygen-containing gas. Then, the control unit 100 cleans the interior of the chamber 12 mainly using a plasma generated by the radio frequency power HF ionizing and dissociating the oxygen-containing gas (step S16).

In the cleaning process, the interior of the chamber 12 is cleaned to remove remnants of a carbon film coating formed in a previous coating process and deposits of by-products generated in a previous etching step, for example. Note, however, that when the interior of the chamber 12 does not have to be cleaned, such as when the chamber 12 is new or close to new, steps S14 and S16 of the cleaning process may be omitted.

Then, the control unit 100 controls the coating process for coating the chamber 12. Specifically, the control unit 100 supplies a gas including a carbon-containing gas as a coating gas (step S18). For example, the control unit 100 may supply $CH_4$ gas and Ar gas as the coating gas including a carbon-containing gas. Then, the control unit 100 causes deposition of carbon in the chamber 12 using a plasma generated from the coating gas including the carbon-containing gas by the radio frequency power HF to cover the interior of the chamber 12 with a carbon film coating (step S20). Then, the control unit 100 unloads the dummy wafer from the chamber 12 (step S22).

Note that conditions of the coating process of step S20 are indicated below.

<Coating Process: Coating Conditions>

| Chamber Pressure | 40 mTorr (5.33 Pa) |
|---|---|
| Radio Frequency Power HF For Plasma Generation | 1000 W |
| Radio Frequency Power LF For Bias Attraction | 1000 W |
| Processing Gas | |
| $CH_4$ gas | 45-55 sccm |
| Ar gas | 450-550 sccm |

According to the above conditions, the ratio of $CH_4$ gas to Ar gas supplied in the coating process will be in the range of 0.09 to 0.11.

Then, the control unit 100 controls the etching process in the chamber 12. First, the control unit 100 loads a product wafer (step S24). Then, the control unit 100 supplies a gas including a fluorocarbon-containing gas as an etching gas (step S26). For example, the control unit 100 may supply $C_4F_6$ gas, Ar gas, and $O_2$ gas as the etching gas including a fluorocarbon-containing gas.

Note that the etching process described above relates to etching performed at a stage where the $SiO_2$ film 120 has been etched until only a small amount of the $SiO_2$ film 120 remains on the $SiN_4$ film 130 covering the gate electrodes 140 shown in FIG. 3, and descriptions of process steps performed before this stage are omitted.

Then, the control unit 100 causes the formation of deposits containing carbon that have been ejected from the carbon film mainly using a plasma generated from the etching gas including the fluorocarbon-containing gas by the radio frequency power HF (step S28: deposition step).

Note that conditions of the deposition process of step S28 are indicated below.

<Etching Process: Deposition Conditions>

| Chamber Pressure | 30 mTorr (4.00 Pa) |
|---|---|
| Radio Frequency Power HF For Plasma Generation | 100 W |
| Radio Frequency Power LF For Bias Attraction | 350 W |
| Processing Gas | |
| $C_4F_6$ gas | 8.46-10.34 sccm |
| Ar gas | 1350-1650 sccm |
| $O_2$ gas | 7.2-8.8 sccm |

Then, the control unit 100 supplies an inert gas (step S30). For example, the control unit 100 may supply Ar gas as the inert gas.

Then, the control unit 100 mainly uses a plasma generated from the inert gas by the radio frequency power HF to cause a reaction between the carbon contained in the deposits and fluorocarbon radicals in the plasma processing space S to thereby promote etching of the $SiO_2$ film 120 (step S32: etching step). In this way, the $SiO_2$ film 120 on the $Si_3N_4$ film 130 covering the gate electrodes 140 can be selectively etched. That is, the selectivity of the $SiO_2$ film 120 to the $Si_3N_4$ film 130 can be improved.

Note that conditions of the etching process of step S32 are indicated below.

<Etching Process: Etching Conditions>

| Chamber Pressure | 30 mTorr (4.00 Pa) |
|---|---|
| Radio Frequency Power HF For Plasma Generation | 100 W |
| Radio Frequency Power LF For Bias Attraction | 350 W |
| Processing Gas | |
| Ar gas | 1350-1650 sccm |

Note that during the transition from the deposition step of step S28 to the etching step of step S32, plasma generation continues without being extinguished.

Then, the control unit 100 determines whether the number of repetitions n is greater than or equal to 20 (step S34). The initial value of the number of repetitions n is set to 1. Upon determining that the number of repetitions n is not greater than or equal to 20, the control unit 100 increments the number of repetitions n by 1 (step S36) and returns to step S26. In this way, the deposition process of step S28 and the etching process of step S32 are repeated until the number of repetitions n reaches 20. In this way, etching characteristics can be improved. When the control unit 100 determines in step S34 that the number of repetitions n is greater than or equal to 20, the control unit 100 ends the present process. The number of repetitions n is not limited to 20 but may be set to any number greater than or equal to 2, for example. The control unit 100 may also set the number n to 1, for example.

As described above, in the plasma process including a coating process according to the present embodiment, the interior of the chamber 12 is precoated with a carbon film before etching the wafer W in the SAC process. In this way, when a radio frequency power RF greater than or equal to a predetermined power is applied to the upper electrode 30 in the etching process performed after the coating process, silicon may be prevented from dispersing into the processing space S and adhering to the wafer W owing to the carbon film covering the interior of the chamber 12.

Further, in the etching process, carbon is ejected from the carbon film covering the upper electrode 30 such that carbon is supplied to the processing space S. In this way, the selectivity of the etching target film can be improved and etching characteristics can be improved. Thus, according to an aspect of the present embodiment, by using optimum carbon film coating conditions, consumption of the gate electrodes 140 may be prevented while improving etching characteristics at the same time. In the following, actual effects of the coating process will be described with reference to FIGS. 4 and 5.

[Carbon Film Coating]

Figure 4:
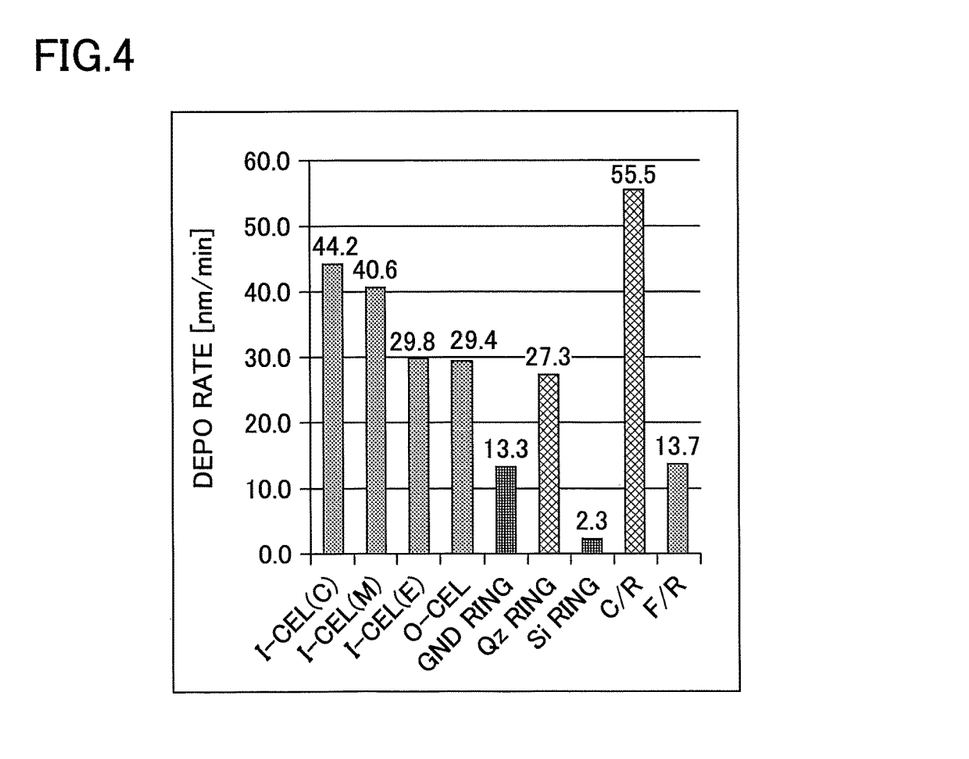
FIG. 4 is a graph representing example experimental results of performing a coating process according to an embodiment of the present invention.

FIG. 4 is a graph showing example deposition rates (nm/min) of carbon in the coating process according to the present embodiment performed under the above coating conditions. First, experimental results relating to the deposition rate (DEPO RATE), i.e., the amount of carbon deposited per minute on the inner cell (I-CEL(C)) 81C at the center portion, the inner cell (I-CEL(E)) 81E at the outermost peripheral portion, and the inner cell (I-CEL(M)) 81M arranged between the inner cells 81C and 81E are described.

The experimental results indicate that the deposition rate of carbon deposited on the inner cell (I-CEL(C)) 81C was 44.2 (nm/min). Further, the deposition rate of carbon deposited on the inner cell (I-CEL(M)) 81M was 40.6 (nm/min). The deposition rate of carbon deposited on the inner cell (I-CEL(E)) 81E was 29.8 (nm/min). Also, the deposition rate of carbon deposited on the outer cell (O-CEL) 82 was 29.4 (nm/min).

Further, the deposition rate of carbon deposited on the ground ring (GND RING) 83 was 13.3 (nm/min). The deposition rate of carbon deposited on the quartz ring (Qz RING) 84 was 27.3 (nm/min). The deposition rate of carbon deposited on the silicon ring (Si RING) 85 was 2.3 (nm/min). The deposition rate of carbon deposited on the cover ring (C/R) 86 was 55.5 (nm/min). The deposition rate of carbon deposited on the focus ring (F/R) 87 was 13.7 (nm/min).

It can be appreciated from the above experimental results that the carbon film can be easily deposited at a relatively high rate on the quartz ring (Qz RING) 84 and the cover ring (C/R) 86 that are made of quartz. On the other hand, the carbon film is deposited at a lower rate on the inner cell (I-CEL(C)) 81C, the inner cell (I-CEL(M)) 81M, the inner cell (I-CEL(E)) 81E, the outer cell (O-CEL) 82, and the focus ring (F/R) 87 that are made of silicon as compared with the deposition rate for the above members made of quartz. Further, the carbon film is deposited at an even lower rate on the silicon members that are grounded, i.e., the ground ring (GND RING) 83 and the silicon ring (Si RING) 85, as compared with the deposition rate for the other silicon members, i.e., the inner cell (I-CEL(C)) 81C, the inner cell (I-CEL(M)) 81M, the inner cell (I-CEL(E)) 81E, the outer cell (O-CEL) 82, and the focus ring (F/R) 87.

Note that when silicon forming the electrode plate 34 of the upper electrode 30 is ejected and dispersed into the processing space S during an etching process to adhere to the wafer W, the etching process is adversely affected. As such, it is important to adjust the thickness of the carbon film covering the inner cell 81 and the outer cell 82 of the upper electrode 30 to such an extent that silicon can be effectively prevented from dispersing to the wafer W. According to the above experimental results, the carbon film was deposited on the inner cell 81 and the outer cell 82 at a deposition rate of about 30 (nm/min) or higher. It could be appreciated from the above that the carbon film was sufficiently coated on the inner cell 81 and the outer cell 82 of the upper electrode 30 to such an extent that silicon would not be dispersed into the processing space S in the subsequent etching process.

[Effects]

Figure 5:
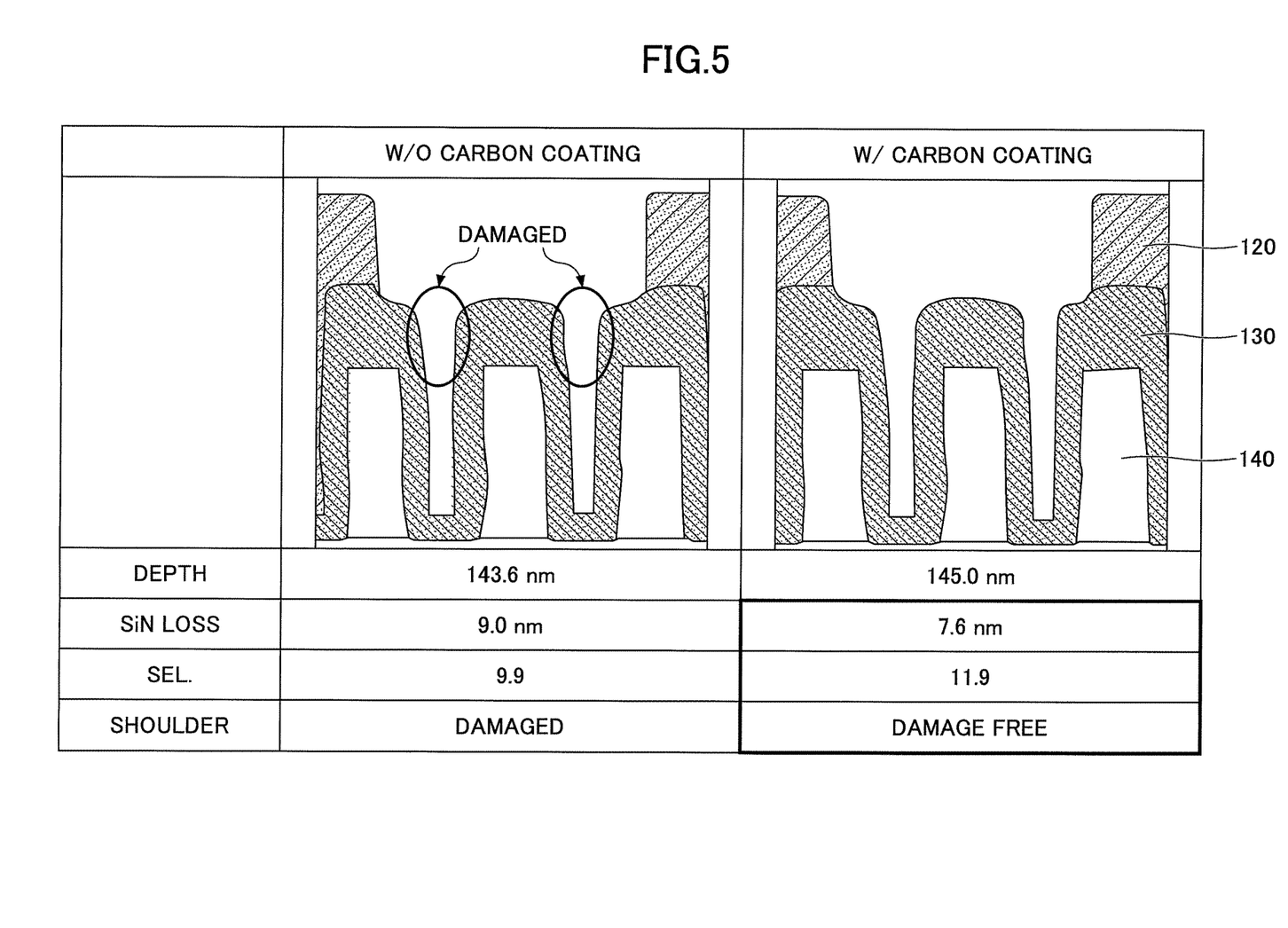
FIG. 5 is a diagram showing example effects of performing the coating process according an embodiment of the present invention.

In the following, the effects of preventing consumption of the gate electrodes 140 while improving etching characteristics at the same time will be described with reference to FIG. 5. The left side of FIG. 5 shows an example result of performing a SAC after an etching process according to a comparative example in which the coating process was not performed. The right side of FIG. 5 shows an example result of performing a SAC process after an etching process according to the present embodiment in which the coating process was performed.

According to these results, in the comparative example in which the coating process was not performed, the depth of holes formed by the SAC process after the etching process was 143.6 nm. Also, the consumption of the $Si_3N_4$ film (SiN LOSS) was 9.0 nm, and the selectivity (SEL.), i.e., the ratio at which the $SiO_2$ film was selectively etched with respect to the $Si_3N_4$ film, was 9.9. Also, as can be appreciated from the left side image of FIG. 5, shoulder portions of the $Si_3N_4$ film were damaged to result in shoulder dropping (shape loss).

In contrast, according to the result of performing the SAC process after the etching process according to the present embodiment in which the coating process was performed, the depth of holes formed by the SAC process was 145.0 nm. Also, the consumption of the $Si_3N_4$ film was 7.6 nm, and the selectivity of the $SiO_2$ film to the $Si_3N_4$ film was 11.9. Also, in the present embodiment, shoulder portions of the $Si_3N_4$ film were substantially free of damage and shoulder dropping was not observed.

It can be appreciated from the above that etching characteristics, in terms of SiN loss and selectivity, could be improved by about 10% in the case where the coating process was performed according to the present embodiment as compared with the etching characteristics of the comparative example in which the coating process was not performed.

Also, it can be appreciated from the above that dispersion of silicon from the upper electrode 30 may be prevented by implementing a carbon film coating process before an etching process. In the etching process, carbon contained in deposits is supplied to the processing space S, and the supplied carbon reacts with fluorocarbon radicals in the processing space S to promote etching of the $SiO_2$ film. In this way the selectivity of the $SiO_2$ film to the $Si_3N_4$ film can be improved and damage to shoulder portions of the $Si_3N_4$ film may be prevented.

[Modification]

Figure 6:
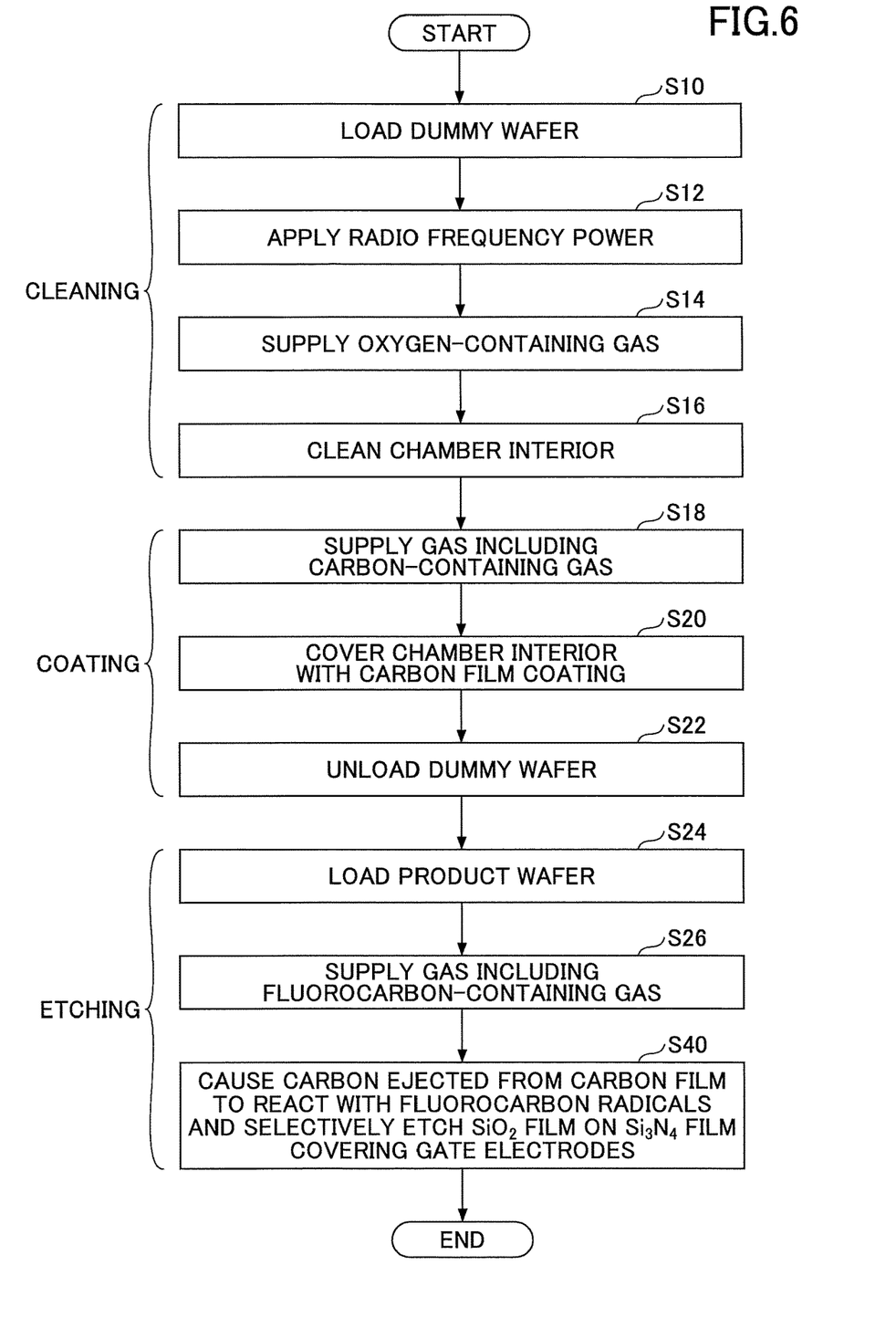
FIG. 6 is a flowchart showing a plasma process including a coating process according to a modified example.

In the following, a modified example of FIG. 2 will be briefly described. FIG. 6 is a flowchart showing an example plasma process including a coating process according to a modified example of the present embodiment. Note that process steps of FIG. 6 that are substantially identical to those of the plasma process shown in FIG. 2 are given the same reference numerals.

According to this modified example, after performing process steps S10 to S24, the control unit 100 controls the supply of a gas including a fluorocarbon-containing gas as an etching gas (step S26). For example, the control unit 100 may control the supply of $C_4F_6$ gas, Ar gas, and $O_2$ gas as the etching gas including a fluorocarbon-containing gas.

Then, the control unit 100 causes the carbon ejected from the carbon film to react with fluorocarbon radicals in the plasma processing space S to promote etching of the $SiO_2$ film 120 (step S32: etching step). In this way, the $SiO_2$ film 120 on the $Si_3N_4$ film 130 covering the gate electrodes 140 can be selectively etched. That is, the selectivity of the $SiO_2$ film 120 to the $Si_3N_4$ film 130 can be improved.

As described above, in the plasma process according to the modified example, a carbon film coating process is implemented before an etching process, and carbon ejected from the carbon film is added to the etching gas including a fluorocarbon-containing gas that is supplied in the etching process. In this way, the $SiO_2$ film 120 can be selectively etched with respect to the $Si_3N_4$ film 130. By improving the etch selectivity in the above-described manner, the shape of the shoulder portions of the $Si_3N_4$ film 130 can be improved and etching characteristics can be improved.

In the etching process according to the modified example, the deposition step (step S28 in FIG. 2) and the etching step (step S32 in FIG. 2) are not repeated. Note, however, that etching characteristics can be further improved by repeating the deposition step and the etching step several dozen times, for example.

Note that the $SiO_2$ film 120 is an example of a silicon oxide-containing film, which is an example of a first silicon-containing film, the $Si_3N_4$ film 130 is an example of a silicon nitride-containing film, which is an example of a second silicon-containing film.

Although a plasma processing method and a plasma processing apparatus according to the present invention have been described above with respect to certain illustrative embodiments, the plasma processing method and the plasma processing apparatus according to the present invention are not limited to the above-described embodiments, and various modifications and improvements may be made without departing from the scope of the present invention. Also, aspects of the embodiments described above can be combined to the extent practicable.

For example, the carbon-containing gas may be a fluorocarbon gas $C_xF_y$, such as $C_4F_6$ gas, $C_5F_8$ gas, $C_6F_6$ gas, or the like.

Also, although a dual-frequency parallel-plate plasma processing apparatus is illustrated in FIG. 1 as an example plasma processing apparatus, the present invention can be applied to other types of plasma processing apparatuses, such as a capacitively coupled plasma (CCP) apparatus, an inductively coupled plasma (ICP) processing apparatus, a plasma processing apparatus using a radial line slot antenna, a helicon wave plasma (HWP) apparatus, an electron cyclotron resonance (ECR) plasma apparatus, a surface wave plasma processing apparatus, and the like.

Also, although the wafer W is described as a workpiece subject to processing in the above description, various other objects, such as a substrate used in an LCD (Liquid Crystal Display) or a FPD (Flat Panel Display), a photomask, a CD substrate, or a printed circuit board, may be subjected to plasma processing according to the present invention.

What is claimed is:

1. A plasma processing method comprising:
    applying a radio frequency power to an upper electrode of a chamber;
    performing a coating process by supplying a coating gas, including a carbon-containing gas, to an interior of the chamber, generating a plasma from the supplied coating gas, and coating the interior of the chamber with a carbon film using the plasma generated from the coating gas; and
    performing an etching process after the coating process by supplying an etching gas, including a fluorocarbon-containing gas, to the interior of the chamber, generating a plasma from the supplied etching gas, and etching a first silicon-containing film that is arranged on a second silicon-containing film covering an electrode formed on a workpiece using the plasma generated from the etching gas, wherein the etching process includes supplying the etching gas including the fluorocarbon-containing gas, depositing a deposit including carbon ejected from the carbon film using the plasma generated from the etching gas, and thereafter supplying an inert gas to generate a plasma from the supplied inert gas and causing a reaction between the carbon contained in the deposit and fluorocarbon radicals using the plasma generated from the inert gas to etch the first silicon-containing film.

2. The plasma processing method according to claim 1, further comprising:
    performing a cleaning process before the coating process by supplying an oxygen-containing gas to the interior of the chamber, generating a plasma from the supplied oxygen-containing gas, and cleaning the interior of the chamber using the plasma generated from the oxygen-containing gas.

3. The plasma processing method according to claim 1, wherein
    the coating gas including the carbon-containing gas supplied in the coating process includes at least one of a hydrocarbon gas, a hydrofluorocarbon gas, and a fluorocarbon gas.

4. The plasma processing method according to claim 3, wherein
    the coating gas including the carbon-containing gas includes at least one of $CH_4$ gas, $CH_3F$ gas, $C_4F_6$ gas, $C_5F_8$ gas, and $C_6F_6$ gas.

5. The plasma processing method according to claim 1, wherein
    the coating gas including the carbon-containing gas is a gas mixture of $CH_4$ gas and an inert gas; and
    the ratio of the $CH_4$ gas to the inert gas is 0.09 to 0.11.

6. The plasma processing method according to claim 1, wherein
    the first silicon-containing film is a silicon oxide-containing film; and
    the second silicon-containing film is a silicon nitride-containing film.

7. The plasma processing method according to claim 1, wherein
    at least a part of a member inside the chamber contains silicon.

8. The plasma processing method according to claim 1, wherein the etching process includes repeating the steps of supplying the etching gas including the fluorocarbon-containing gas and supplying the inert gas a predetermined number of times.

* * * * *